(12) United States Patent
DeBergalis et al.

(10) Patent No.: US 8,197,933 B2
(45) Date of Patent: *Jun. 12, 2012

(54) FLUOROPOLYMER COATED FILMS USEFUL FOR PHOTOVOLTAIC MODULE

(75) Inventors: Michael DeBergalis, East Amherst, NY (US); Larry Glen Snow, Leroy, NY (US)

(73) Assignee: E.I. du Pont de Nemours and Company, Wilmington, DE (US)

(*) Notice: Subject to any disclaimer, the term of this patent is extended or adjusted under 35 U.S.C. 154(b) by 0 days.

This patent is subject to a terminal disclaimer.

(21) Appl. No.: 13/245,033

(22) Filed: Sep. 26, 2011

(65) Prior Publication Data

US 2012/0024352 A1   Feb. 2, 2012

Related U.S. Application Data

(63) Continuation of application No. 11/642,183, filed on Dec. 20, 2006, now Pat. No. 7,553,540.

(60) Provisional application No. 60/755,197, filed on Dec. 30, 2005.

(51) Int. Cl.
| | |
|---|---|
| B32B 27/08 | (2006.01) |
| B32B 27/20 | (2006.01) |
| B32B 27/30 | (2006.01) |
| B32B 27/36 | (2006.01) |
| H01L 31/048 | (2006.01) |
| H02N 6/00 | (2006.01) |

(52) U.S. Cl. ........ 428/323; 428/335; 428/420; 428/421; 428/480; 136/251

(58) Field of Classification Search .................. None
See application file for complete search history.

(56) References Cited

U.S. PATENT DOCUMENTS

| | | | |
|---|---|---|---|
| 2,419,008 A | 4/1947 | Coffman et al. | |
| 2,510,783 A | 6/1950 | Johnston et al. | |
| 2,599,300 A | 6/1952 | Upson | |
| 3,087,827 A | 4/1963 | Klenke, Jr. et al. | |
| 3,087,828 A | 4/1963 | Linton | |
| 3,087,829 A | 4/1963 | Linton | |
| 3,133,854 A | 5/1964 | Simms | |
| 3,524,906 A | 8/1970 | Schmitt et al. | |
| 3,716,599 A | 2/1973 | Vasta | |
| 4,074,014 A | 2/1978 | Wollen | |
| 4,212,914 A | 7/1980 | Ponomareva et al. | |
| 4,273,829 A | 6/1981 | Perreault | |
| 4,314,004 A | 2/1982 | Stoneberg | |
| 4,323,554 A * | 4/1982 | Bernhard | 424/63 |
| 4,393,106 A | 7/1983 | Maruhashi et al. | |
| 4,416,925 A | 11/1983 | Goll | |
| 4,478,889 A | 10/1984 | Maruhashi et al. | |
| 4,522,866 A | 6/1985 | Nishikawa | |
| 4,557,977 A | 12/1985 | Memmer et al. | |
| 4,581,412 A | 4/1986 | Ohmori et al. | |
| 4,659,768 A | 4/1987 | Tortorello et al. | |
| 4,698,110 A | 10/1987 | Vassiliou | |
| 4,699,809 A | 10/1987 | Maruhashi et al. | |
| 4,743,492 A | 5/1988 | Wilson, II | |
| 4,786,546 A * | 11/1988 | Vassiliou | 428/215 |
| 4,923,718 A | 5/1990 | Iida et al. | |
| 4,931,324 A | 6/1990 | Ellison et al. | |
| 4,988,540 A | 1/1991 | Bragaw | |
| 5,139,878 A | 8/1992 | Kim et al. | |
| 5,169,915 A | 12/1992 | Mohri et al. | |
| 5,292,796 A | 3/1994 | Dams et al. | |
| 5,453,540 A | 9/1995 | Dams et al. | |
| 5,707,697 A | 1/1998 | Spain et al. | |
| 5,759,639 A | 6/1998 | Kloos | |
| 5,846,650 A | 12/1998 | Ko et al. | |
| 6,060,158 A | 5/2000 | Ono et al. | |
| 6,080,487 A | 6/2000 | Coggio et al. | |
| 6,242,547 B1 | 6/2001 | Uschold | |
| 6,383,620 B1 | 5/2002 | Aoyama et al. | |
| 6,403,740 B1 | 6/2002 | Uschold | |
| 6,632,518 B1 * | 10/2003 | Schmidt et al. | 428/335 |
| 6,833,414 B2 | 12/2004 | Granel et al. | |
| 7,270,870 B2 | 9/2007 | Hetzler et al. | |
| 7,553,540 B2 * | 6/2009 | Debergalis et al. | 428/335 |
| 7,981,478 B2 | 7/2011 | Snow | |
| 8,012,542 B2 | 9/2011 | Snow | |
| 8,025,928 B2 | 9/2011 | Snow | |
| 8,048,518 B2 * | 11/2011 | Debergalis et al. | 428/335 |
| 8,062,744 B2 | 11/2011 | Debergalis | |
| 2002/0012801 A1 | 1/2002 | Oreins et al. | |
| 2003/0087103 A1 | 5/2003 | Belmares et al. | |
| 2004/0059033 A1 | 3/2004 | Toriumi | |

(Continued)

FOREIGN PATENT DOCUMENTS

CN    1 657 579    8/2005

(Continued)

OTHER PUBLICATIONS

Office Action, U.S. Appl. No. 11/642,183, Oct. 1, 2008.

(Continued)

*Primary Examiner* — Ramsey Zacharia

(57) ABSTRACT

A photovoltaic module backsheet includes a polyester film having opposite first and second surfaces, and first and second fluoropolymer coatings on the first and second surfaces of the polyester film. The first and second fluoropolymer coatings each include fluoropolymer selected from homopolymers and copolymers of vinyl fluoride and homopolymers and copolymers of vinylidene fluoride polymer blended with compatible adhesive polymer. The compatible adhesive polymer includes a backbone that is compatible with the fluoropolymer and pendant functional groups. The pendant functional groups are selected from carboxylic acid, sulfonic acid, aziridine, anhydride, amine, isocyanate, melamine, epoxy, hydroxy and mixtures thereof. The surfaces of the polyester film include functional groups on each surface that interact with the pendant functional groups of the compatible adhesive polymer in the first and second fluoropolymer coatings to promote bonding of the first and second fluoropolymer coatings to the respective surfaces of the polyester film.

19 Claims, No Drawings

U.S. PATENT DOCUMENTS

| | | |
|---|---|---|
| 2004/0197568 A1 | 10/2004 | Jing et al. |
| 2005/0158558 A1 | 7/2005 | Hayashida et al. |
| 2006/0148350 A1 | 7/2006 | Chang et al. |
| 2006/0148971 A1 | 7/2006 | Jing et al. |
| 2006/0199029 A1 | 9/2006 | Liu et al. |
| 2006/0234038 A1 | 10/2006 | Kernander et al. |
| 2006/0280922 A1 | 12/2006 | Hull et al. |

FOREIGN PATENT DOCUMENTS

| | | |
|---|---|---|
| EP | 0 467 570 A2 | 1/1992 |
| FR | 2 654 736 | 5/1991 |
| GB | 1 395 432 | 5/1975 |
| JP | 57-037711 | 3/1982 |
| JP | 2-151608 | 6/1990 |
| JP | 2-170855 | 7/1990 |
| JP | 3-212411 | 9/1991 |
| JP | 3-294347 | 12/1991 |
| JP | 6-211945 | 8/1994 |
| JP | 10-138264 | 5/1998 |
| JP | 11-309830 | 11/1999 |
| JP | 2000-301053 | 10/2000 |
| JP | 2006-031951 A | 2/2006 |
| JP | 2006-169328 | 6/2006 |
| WO | WO 97/49777 | 12/1997 |
| WO | WO 2006/086081 A1 | 8/2006 |
| WO | WO 2007/009140 A1 | 1/2007 |

OTHER PUBLICATIONS

Office Action, U.S. Appl. No. 11/642,071, Nov. 19, 2009.
Office Action, U.S. Appl. No. 11/642,071, Jan. 8, 2009.
Notice of Allowance, U.S. Appl. No. 11/642,183, May 13, 2009.
Office Action, U.S. Appl. No. 12/492,372, Mar. 29, 2010.
Office Action, U.S. Appl. No. 12/492,375, Jul. 16, 2010.
Office Action, U.S. Appl. No. 11/642,071, Aug. 3, 2010.
Office Action, U.S. Appl. No. 12/492,372, Oct. 20, 2010.
Office Action, U.S. Appl. No. 12/797,920, Nov. 9, 2010.
Office Action, U.S. Appl. No. 11/642,071, Dec. 1, 2010.
Notice of Allowance, U.S. Appl. No. 12/492,372, Dec. 30, 2010.
Office Action, U.S. Appl. No. 12/492,375, Jan. 4, 2011.
Office Action, U.S. Appl. No. 12/101,413, Dec. 21, 2010.
Office Action, U.S. Appl. No. 12/969,865, Jan. 27, 2011.
Office Action, U.S. Appl. No. 12/797,920, Mar. 15, 2011.
Notice of Allowance, U.S. Appl. No. 11/642,071, Apr. 27, 2011.
Office Action, U.S. Appl. No. 12/101,413, May 26, 2011.
Notice of Allowance, U.S. Appl. No. 12/797,920, Jun. 1, 2011.
Notice of Allowance, U.S. Appl. No. 12/492,375, Jul. 7, 2011.
Notice of Allowance, U.S. Appl. No. 12/492,372, Jul. 8, 2011.
Office Action, U.S. Appl. No. 12/101,413, Oct. 12, 2011.
Michael DeBergalis, Fluoropolymer Films in the Photovoltaic Industry, Journal of Fluorine Chemistry 125 (2004) 1255-1257.
Notice of Allowance, U.S. Appl. No. 12/101,413, Apr. 11, 2008.
Office Action, U.S. Appl. No. 12/970,209, Dec. 16, 2010.

* cited by examiner

FLUOROPOLYMER COATED FILMS USEFUL FOR PHOTOVOLTAIC MODULE

CROSS REFERENCE TO RELATED APPLICATIONS

This application is a continuation of application Ser. No. 11/642,183 filed Dec. 20, 2006, now U.S. Pat. No. 7,553,540.

FIELD OF INVENTION

This invention relates to a fluoropolymer coated film which is useful as a backsheet in a photovoltaic module.

BACKGROUND OF THE INVENTION

Photovoltaic cells are used to produce electrical energy from sunlight, offering a green alternative to traditional methods of electricity generation. These solar cells are built from various semiconductor systems which must be protected from environmental effects such as moisture, oxygen, and UV light. The cells are usually jacketed on both sides by encapsulating layers of glass and/or plastic films forming a multilayer structure known as a photovoltaic module. Fluoropolymer films are recognized as an important component in photovoltaic modules due to their excellent strength, weather resistance, UV resistance, and moisture barrier properties. Especially useful in these modules are film composites of fluoropolymer film and polyester film which act as a backing sheet for the module. Such composites have traditionally been produced from preformed films of fluoropolymer, specifically polyvinyl fluoride (PVF), adhered to polyester substrate film, specifically polyethylene terephthalate. When fluoropolymer such as PVF is used as a backing sheet to the module, its properties significantly improve module life, allowing module warranties of up to 25 years. Fluoropolymer backing sheets are frequently employed in the form of laminate with polyethylene terephthalate (PET) films, typically with the PET sandwiched between two fluoropolymer films.

However, laminates of preformed fluoropolymer films on polymeric substrates having a bond which will not delaminate after years of outdoor exposure are difficult to make. Prior art systems such as U.S. Pat. No. 3,133,854 to Simms, U.S. Pat. No. 5,139,878 to Kim et al., and U.S. Pat. No. 6,632,518 to Schmidt et al. describe primers and adhesives for preformed films that will produce durable laminate structures. However, these processes require the application of at least one adhesive layer, or both a primer and adhesive layer, prior to the actual lamination step. The lamination step then requires the application of heat and pressure to form the laminate. Therefore, prior art laminates using preformed fluoropolymer films are expensive to manufacture and/or require capital intensive equipment. Because preformed fluoropolymer films must have sufficient thickness to provide strength for handling during manufacture and subsequent processing, the resulting laminates may also incorporate thick expensive layers of fluoropolymer, i.e., thicker than are necessary for an effective protective layer.

SUMMARY OF THE INVENTION

A photovoltaic module backsheet includes a polyester film having opposite first and second surfaces, and first and second fluoropolymer coatings on the first and second surfaces of the polyester film, respectively. The first and second fluoropolymer coatings each include fluoropolymer selected from homopolymers and copolymers of vinyl fluoride and homopolymers and copolymers of vinylidene fluoride polymer blended with compatible adhesive polymer. The compatible adhesive polymer includes a backbone that is compatible with the fluoropolymer and pendant functional groups. The pendant functional groups are selected from carboxylic acid, sulfonic acid, aziridine, anhydride, amine, isocyanate, melamine, epoxy, hydroxy and mixtures thereof. The first and second surfaces of the polyester film include functional groups on each surface that interact with the pendant functional groups of the compatible adhesive polymer in the first and second fluoropolymer coatings to promote bonding of the first and second fluoropolymer coatings to the respective first and second surfaces of the polyester film.

The invention provides a fluoropolymer coated polymer film with fewer overall processing steps than manufacturing laminates with preformed fluoropolymer films while providing strong adhesion to the substrate and good durability to the fluoropolymer coated substrate. In addition, providing the fluoropolymer in the form of a coating enables thinner fluoropolymer layers if desired to save cost. Employing fluoropolymer coatings also enables the incorporation of additives into the fluoropolymer layer tailored to the intended use of the fluoropolymer coated film, e.g., fillers which improve barrier properties.

DETAILED DESCRIPTION OF THE INVENTION

Fluoropolymers

Fluoropolymers useful in the fluoropolymer coated film in accordance with the invention are selected from homopolymers and copolymers of vinyl fluoride (VF) and homopolymers and copolymers of vinylidene fluoride (VF2) polymer. Preferably, the fluoropolymer is selected from homopolymers and copolymers of vinyl fluoride comprising at least 60 mole % vinyl fluoride and homopolymers and copolymers of vinylidene fluoride comprising at least 60 mole % vinylidene fluoride. More preferably, the fluoropolymer is selected from homopolymers and copolymers of vinyl fluoride comprising at least 80 mole % vinyl fluoride and homopolymers and copolymers of vinylidene fluoride comprising at least 80 mole % vinylidene fluoride. Blends of the fluoropolymers with nonfluoropolymers, e.g., acrylic polymers, may also be suitable for the practice of the invention. Homopolymer polyvinyl fluoride (PVF) and homopolymer polyvinylidene fluoride (PVDF) are well suited for the practice of the invention.

For the practice of the invention with VF copolymers or VF2 copolymers, comonomers can be either fluorinated or nonfluorinated or mixtures thereof. By the term "copolymers" is meant copolymers of VF or VF2 with any number of additional fluorinated monomer units so as to form dipolymers, terpolymers, tetrapolymers, etc. If nonfluorinated monomers are used, the amount used should be limited so that the copolymer retains the desirable properties of the fluoropolymer, i.e., weather resistance, solvent resistance, barrier properties, etc. Preferably, fluorinated comonomers are used including fluoroolefins, fluorinated vinyl ethers, or fluorinated dioxoles. Examples of useful fluorinated comonomers include tetrafluoroethylene (TFE), hexafluoropropylene (HFP), chlorotrifluoroethylene (CTFE), trifluoroethylene, hexafluoroisobutylene, perfluorobutyl ethylene, perfluoro (propyl vinyl ether) (PPVE), perfluoro (ethyl vinyl ether) (PEVE), perfluoro (methyl vinyl ether) (PMVE), perfluoro-2,2-dimethyl-1,3-dioxole (PDD) and perfluoro-2-methylene-4-methyl-1,3-dioxolane (PMD) among many others.

Homopolymer PVDF coatings can be formed from a high molecular weight PVDF. Blends of PVDF and alkyl(meth) acrylates polymers can be used. Polymethyl methacrylate is particularly desirable. Typically, these blends can comprise 50-70% by weight of PVDF and 30-50% by weight of alkyl (meth)acrylate polymers, preferably, polymethyl methacrylate. Such blends may contain compatibilizers and other additives to stabilize the blend. Such blends of polyvinylidene fluoride, or vinylidene fluoride copolymer, and acrylic resin as the principal components are described in U.S. Pat. Nos. 3,524,906; 4,931,324; and 5,707,697.

Homopolymer PVF coatings can be formed from a high molecular weight PVF. Suitable VF copolymers are taught by U.S. Pat. Nos. 6,242,547 and 6,403,740 to Uschold.

Compatible Adhesive Polymers

The compatible adhesive polymers employed in the fluoropolymer coated film according to the invention comprise functional groups selected from carboxylic acid, sulfonic acid, aziridine, amine, isocyanate, melamine, epoxy, hydroxy, anhydride and mixtures thereof. The compatible adhesive polymer preferably has (1) a backbone composition that is compatible with the fluoropolymer in the composition and (2) pendant functionality capable of reacting with complementary functional groups on a substrate film surface. The compatibility of the adhesive polymer backbone with the fluoropolymer will vary but is sufficiently compatible so that the adhesive polymer can be introduced into the fluoropolymer in the desired amount to secure the fluoropolymer coating to the substrate film. In general however, homo and copolymers derived largely from vinyl fluoride and vinylidene fluoride will show compatibility characteristics that will favor acrylic, urethane, aliphatic polyester, polyester urethane, acrylamide, urea and polycarbonate backbones having the functional groups described above.

The free radical addition polymers derived from acrylic and acrylamide monomers are well suited to the introduction of pendant functional groups using the wealth of functional monomers available. Some representatives include glycidyl acrylate and methacrylate for the introduction of epoxy groups. These can then be converted into reactive aminoalcohol groups by reaction of the epoxy functional acrylic with ammonia or primary alkylamines. Carboxylic acid, isocyanate, hydroxy and anhydride functionalities are all available using acrylic/methacrylic acid, isocyanatoethyl methacrylate, hydroxyethyl methacrylate or maleic anhydride respectively. Numerous other functional monomers are available for functional group introduction as is well known in the art.

Preferred compatible adhesive polymers are amine functional polymers, more preferably, amine functional acrylic polymers.

Pigments and Fillers

If desired, various color, opacity and/or other property effects can be achieved by incorporating pigments and fillers into the fluoropolymer coating composition dispersion during manufacture. Pigments preferably are used in amounts of about 1 to about 35 wt % based on fluoropolymer solids. Typical pigments that can be used include both clear pigments, such as inorganic siliceous pigments (silica pigments, for example) and conventional pigments. Conventional pigments that can be used include metallic oxides such as titanium dioxide, and iron oxide; metal hydroxides; metal flakes, such as aluminum flake; chromates, such as lead chromate; sulfides; sulfates; carbonates; carbon black; silica; talc; china clay; phthalocyanine blues and greens, organo reds; organo maroons and other organic pigments and dyes. Preferred are pigments that are stable at high temperatures during processing. It is also preferable that the type and amount of pigment is selected to prevent any significant adverse affects on the desirable properties of fluoropolymer coating, e.g., weatherability.

Pigments can be formulated into a millbase by mixing the pigments with a dispersing resin that may be the same as or compatible with the fluropolymer composition into which the pigment is to be incorporated. Pigment dispersions can be formed by conventional means, such as sand grinding, ball milling, attritor grinding or two-roll milling. Other additives, while not generally needed or used, such as fiber glass and mineral fillers, anti-slip agents, plasticizers, nucleating agents, and the like, can be incorporated.

UV Additives and Thermal Stabilizers

The fluoropolymer coating compositions may contain one or more light stabilizers as additives. Light stabilizer additives include compounds that absorb ultraviolet radiation such as hydroxybenzophenones and hydroxybenzotriazoles. Other possible light stabilizer additives include hindered amine light stabilizers (HALS) and antioxidants. Thermal stabilizers can also be used if desired.

Barrier Particles

In a preferred embodiment, the fluoropolymer coating composition includes barrier particles. Preferably, the particles are platelet-shaped particles. Such particles tend to align during application of the coating and, since water, solvent and gases such as oxygen cannot pass readily through the particles themselves, a mechanical barrier is formed in the resulting coating which reduces permeation of water, solvent and gases. In a photovoltaic module, for example, the barrier particles substantially increase the moisture barrier properties of the fluoropolymer and enhance the protection provided to the solar cells. If used, barrier particles are preferably present in the amount of about 0.5 to about 10% by weight based on the total dry weight of the fluoropolymer composition in the coating.

Examples of typical platelet shaped filler particles include mica, glass flake and stainless steel flake, and aluminum flake. The platelet shaped particles are preferably mica particles, including mica particles coated with an oxide layer such as iron or titanium oxide. These particles have an average particle size of about 10 to 200 μm, preferably 20-100 μm, with no more than 50% of the particles of flake having average particle size of more than about 300 μm. The mica particles coated with an oxide layer are described in U.S. Pat. No. 3,087,827 (Klenke and Stratton); U.S. Pat. No. 3,087,828 (Linton); and U.S. Pat. No. 3,087,829 (Linton). The micas described in these patents are coated with oxides or hydrous oxides of titanium, zirconium, aluminum, zinc, antimony, tin, iron, copper, nickel, cobalt, chromium, or vanadium. Mixtures of coated micas can also be used.

Fluoropolymer Coating Composition Formulation

The fluoropolymer coating compositions may contain the fluoropolymer either in the form of a solution or dispersion of the fluoropolymer. Typical solutions or dispersions for the fluoropolymer are prepared using solvents which have boiling points high enough to avoid bubble formation during the film forming/drying process. For polymers in dispersion form, a solvent which aids in coalescence of the fluoropolymer is preferable. The polymer concentration in these solutions or dispersions is adjusted to achieve a workable viscosity of the solution and will vary with the particular polymer, the other components of the composition, and the process equipment and conditions used. Preferably, for solutions the fluoropolymer is present in an amount of about 10 wt % to about 25 wt % based the total weight of the composition. For dispersions, the fluoropolymer is preferably present in an amount of about 25 wt % to about 50 wt % based the total weight of the composition.

The form of the polymer in the coating composition is dependent upon the type of fluoropolymer and the solvent used. Homopolymer PVF is normally in dispersion form. Homopolymer PVDF can be in dispersion or solution form dependent upon the solvent selected. For example, homopolymer PVDF can form stable solutions at room temperature in many polar organic solvents such as ketones, esters and some ethers. Suitable examples include acetone, methylethyl ketone (MEK) and tetrahydrofuran (THF). Depending upon comonomer content and the solvent selected, copolymers of VF and VF2 may be used either in dispersion or solution form.

In one preferred form of the invention using homopolymer polyvinyl fluoride (PVF), suitable coating formulations are prepared using dispersions of the fluoropolymer. The nature and preparation of dispersions are described in detail in U.S. Pat. Nos. 2,419,008; 2,510,783; and 2,599,300. Preferred PVF dispersions are formed in dimethyl acetamide, propylene carbonate, y-butyrolactone, N-methyl pyrrolidone, and dimethylsulfoxide.

To prepare the fluoropolymer coating composition in dispersion form, the fluoropolymer and the compatible adhesive polymer and, optionally one or more dispersants and/or pigments, are generally first milled together in a suitable solvent. Alternatively, the various components are milled or appropriately mixed separately. Components which are soluble in the solvent such as the compatible adhesive polymer do not require milling.

A wide variety of mills can be used for the preparation of the dispersion. Typically, the mill employs a dense agitated grinding medium, such as sand, steel shot, glass beads, ceramic shot, Zirconia, or pebbles, as in a ball mill, an ATTRITOR® available from Union Process, Akron, Ohio, or an agitated media mill such as a "Netzsch" mill available from Netzsch, Inc., Exton, Pa. The dispersion is milled for a time sufficient to cause deagglomeration of the PVF. Typical residence time of the dispersion in a Netzsch mill ranges from thirty seconds up to ten minutes.

The adhesive polymer is employed in the coating composition at a level sufficient to provide the desired bonding to the polymeric substrate film but below the level at which the desirable properties of the fluoropolymer would be significantly adversely affected. Preferably, coating composition contains about 1 to about 40 wt % adhesive polymer, more preferably about 1 to about 25 wt % adhesive polymer, and most preferably 1 to about 20 wt % adhesive polymer, based on the weight of the fluoropolymer.

Substrate Films and Primers

Polymeric substrate films used in this invention may be selected from a wide number of polymers, with thermoplastics being preferred. The polymeric substrate film comprises functional groups on its surface that interact with the compatible adhesive polymer to promote bonding of the fluoropolymer coating to the substrate film. The polymeric substrate film is preferably a polyester, and more preferably a polyester selected from the group consisting of polyethylene terephthalate, polyethylene naphthalate and a coextrudate of polyethylene terephthalate/polyethylene naphthalate.

Fillers may also be included in the substrate film, where their presence may improve the physical properties of the substrate, for example, higher modulus and tensile strength. They may also improve adhesion of the fluoropolymer to the substrate film. One exemplary filler is barium sulfate, although others may also be used.

The surface of the polymeric substrate film which is to be coated may naturally possess functional groups suitable for bonding as in hydroxy and/or carboxylic acid in a polyester film or amine and/or acid functionality in a polyamide film. Many polymeric substrate films may need or would further benefit from activation however, and this may be achieved by surface treatment. That is, the surface can be made receptive by forming functional groups of carboxylic acid, sulfonic acid, aziridine, amine, isocyanate, melamine, epoxy, hydroxy, anhydride and/or mixtures thereof on the surface. The activation can be achieved by chemical exposure such as to a gaseous Lewis acid such as $BF_3$ or to sulfuric acid or to hot sodium hydroxide. Preferably, the surface can be activated by exposing one or both surfaces to an open flame while cooling the opposite surface. Activation can also be achieved by subjecting the film to a high frequency, spark discharge such as corona treatment or atmospheric nitrogen plasma treatment.

In a preferred embodiment of this invention, a primer layer is deposited on the polymer substrate film and provides the functional groups that interact with the compatible adhesive polymer in the fluoropolymer coating composition to promote bonding of the fluoropolymer coating to the substrate film. In one embodiment, the primer layer has a thickness of about 20 to about 100 nm. Suitable primers may include polyamines, polyamides, acrylamide polymers (especially amorphous acrylamides), polyethyleneimines, ethylene copolymers or terpolymers, acid-modified polyolefins (e.g. maleated polyolefins), acrylate or methacrylate polymers (e.g., emulsion polymers), polyester (e.g., dispersions), polyurethanes (e.g., dispersions), epoxy polymers, epoxyacrylic oligomers, and mixtures thereof. An example of this is the introduction of amine functionality by the application of a polyethyleneimine primer coating. A second example is coextrusion of an acid or anhydride functional thermoplastic polymer, such as the polymer sold by the DuPont Company under the trademark BYNEL®, with the base PET substrate film. When primers are used on, for example, PET substrate films which are stretched during manufacture, the primer can be applied either before or after the substrate film has been stretched.

Coating Application

The fluoropolymer compositions for making the fluoropolymer coated film in accordance with the present invention can be applied as a liquid directly to suitable polymeric substrate films by conventional coating means with no need to form a preformed film. Techniques for producing such coatings include conventional methods of casting, dipping, spraying and painting. When the fluoropolymer coating contains fluoropolymer in dispersion form, it is typically applied by casting the dispersion onto the substrate film, using conventional means, such as spray, roll, knife, curtain, gravure coaters, or any other method that permits the application of a uniform coating without streaks or other defects. Spray and roller applications are the most convenient application methods. The dry coating thickness of cast dispersion is preferably about 2.5 μm (0.1 mil) and about 250 μm (10 mils), preferably between about 13 μm (0.5 mil) to about 130 μm (5 mils).

After application, the wet solutions or dispersion are dried to remove the solvent and coalesced thermally if necessary to form the fluoropolymer coating on the substrate film. With some compositions in which the fluoropolymer is in solution form, the compositions can be coated onto substrate films and allowed to air dry at ambient temperatures. Although not necessary to produce a coalesced film, heating is generally desirable to dry the coating more quickly. Drying temperature thus preferably in the range of about 25° C. (ambient conditions) to about 200° C. (oven temperature—the film temperature will be lower). The temperature used should also be sufficient to promote the interaction of the functional groups in the adhesive polymer with the functional groups of the polymeric substrate film to provide secure bonding of the fluoropolymer coating to the substrate film. This temperature varies widely with the adhesive polymer employed and the functional groups of substrate film and can range from room temperature to oven temperatures in excess of that required for the coalescence of fluoropolymers in dispersion form as discussed below.

When the fluoropolymer in the composition is in dispersion form, it is necessary for the solvent to be removed and also for the fluoropolymer to be heated to a sufficiently high temperature that the fluoropolymer particles coalesce into a continuous film. Preferably, fluoropolymer in the coating is heated to temperature of about 150° C. to about 250° C. The solvent used preferably aids in coalescence, i.e., enables a lower temperature to be used for coalesce than would be necessary with no solvent present. Thus, the conditions used to coalesce polymer will vary with the fluoropolymer used, the thickness of the cast dispersion and the substrate film, and other operating conditions. For homopolymer PVF coatings and residence times of about 1 to about 3 minutes, oven temperatures of about from 340° F. (171° C.) to about 480° F. (249° C.) can be used to coalesce the film, and temperatures of about 380° F. (193° C.) to about 450° F. (232° C.) have been found to be particularly satisfactory. The oven air temperatures, of course, are not representative of the temperatures reached by the fluoropolymer coating which will be lower.

In a preferred form of the invention, the fluoropolymer coating composition is applied to a substrate film. Preferably, the substrate film includes a primer layer providing functional groups that interact with said compatible adhesive polymer to promote bonding. Preferably, the substrate film is polyester such a polyethylene terephthalate, polyethylene napthalate or a coextrudate of polyethylene terephthalate/polyethylene naphthalate. In another preferred form of the invention, the fluoropolymer coating is applied to both surfaces of the substrate film. This can be performed simultaneously on both sides of the polymeric substrate film or alternately, the coated substrate film can be dried, turned to the uncoated side and resubmitted to the same coating head to apply coating to the opposite side of the film to achieve coating on both sides of the film.

Photovoltaic Modules

Fluoropolymer coated films made in accordance with the invention are especially useful in photovoltaic modules. A typical construction for a photovoltaic module includes a thick layer of glass as a glazing material. The glass protects solar cells comprising crystalline silicon wafers and wires which are embedded in a moisture resisting plastic sealing compound such as cross-linked ethylene vinyl acetate. Alternatively thin film solar cells can be applied from various semiconductor materials, such as CIGS (copper-indium-gallium-selenide), CTS (cadmium-tellurium-sulfide), a-Si (amorphous silicon) and others on a carrier sheet which is also jacketed on both sides with encapsulant materials. Adhered to the encapsulant is a backsheet. Fluoropolymer coated films made in accordance with the invention are useful for such backsheets. The fluoropolymer coating comprises fluoropolymer selected from homopolymers and copolymers of vinyl fluoride and homopolymers and copolymers of vinylidene fluoride polymer blended with compatible adhesive polymer containing functional groups selected from carboxylic acid, sulfonic acid, aziridine, anhydride, amine, isocyanate, melamine, epoxy, hydroxy, anhydride and mixtures thereof. The polymeric substrate film comprises functional groups on its surface that interact with the compatible adhesive polymer to promote bonding of the fluoropolymer coating to the substrate film. The polymeric substrate film is preferably a polyester, and more preferably a polyester selected from the group consisting of polyethylene terephthalate, polyethylene naphthalate and a coextrudate of polyethylene terephthalate/polyethylene naphthalate. Polyester provides electrical insulation and moisture barrier properties, and is an economical component of the back sheet. Preferably both surfaces of the polymeric substrate film is coated with fluoropolymer creating a sandwich of polyester between two layers of coating of fluoropolymer. Fluoropolymer films provide excellent strength, weather resistance, UV resistance, and moisture barrier properties to the backsheet.

EXAMPLES

Test Methods

180 Degree Peel Strength

Peel strengths are measured using a Model 4201 Instron at 2"/min, recording the peak value and averaging 3 samples (ASTM D1876-01 T-Peel Test). If samples easily peeled by hand during the peel initiation step a value of 0 was recorded.

Humidity Cabinet Peel Test

After removal from the humidity cabinet the samples are scored with a razor knife and a straight edge to produce ¼" wide strips. The 1" overhang is used as a handle and this tab is pulled at roughly a 180 degree angle with slow even tension until either the film breaks or a peel results. Film breaks and peels at either the EVA/glass or EVA/fluoropolymer coating interfaces are considered passing results. Peels between the fluoropolymer coating and the PET substrate are considered failures.

Cross-Hatch Adhesion

After removal from the humidity cabinet the samples are scored with a razor knife, aided by a stainless steel template, to make 11 parallel cuts about 3/32 inch (2.4 mm) apart through the film to the glass surface. This procedure is repeated at right angles to the first cuts to produce a grid of 100 squares. A strip of transparent tape (3M Brand No. 467 PSA tape), 0.75 by 2.16 inch (1.9 by 5.5 cm), is pressed firmly over the scribed area with the tape oriented in a parallel direction to the scribed lines. The tape is then pulled off at a 90° angle rapidly but without jerking. Any failure between the fluoropolymer coating and the PET substrate is considered a failure.

Water Vapor Transmission Rate (WVTR)

Water Vapor Transmission Rate is measured using a Mocon Permatron-W® 700 Instrument at 37.8° C. and a permiant relative humidity of 100%.

Examples 1-5

Examples 1 to 5 illustrate bonding PVF based coatings containing an amine functional acrylic adhesive or an epoxy functional acrylic adhesive being used to coat polyethylene terephthalate (PET) films previously primed with either polyethyleneimine (PEI) or ethylene acrylic acid copolymer (EAA). Results show that in general more adhesive polymer is better. Results indicate that no significant bonding is achieved in the absence of the adhesive polymer.

PVF Based Coating Formulations

TABLE 1

Fluoropolymer Coating Formulations

| Formulation | PVF Dispersion* | Adhesive Polymer** | Amount Adhesive Polymer | Wt % Adhesive based on PVF |
|---|---|---|---|---|
| A | 20.0 | Amine functional acrylic | 2.8 | 10 |
| B | 20.0 | Amine functional acrylic | 5.6 | 20 |
| C | 20.0 | Epoxy functional acrylic | 2.2 | 10 |
| D | 20.0 | Epoxy functional acrylic | 4.4 | 20 |
| E | 20.0 | None | 0 | 0 |

*PVF (available from DuPont) previously dispersed into propylene carbonate (available from Huntsman) at 42% solids
**amine functional acrylic is methyl methacrylate/2-hydroxy-3-aminopropyl methacrylate 97.8/2.2 at 30% solids in 2-propanol/toluene 55/45.
**Epoxy functional acrylic is methyl methacrylate/glycidyl methacrylate 98/2 at 38% solids in 2-propanol/toluene 55/45.

PET+Primer Substrates

TABLE 2

Substrates with PEI Coatings

| Substrate | PET thickness (microns) | PEI | Coating Thickness (nm) |
|---|---|---|---|
| Sample 1 | 100 | Lupasol ® P | 20 |
| Sample 2 | 100 | Lupasol ® SKA | 20 |
| Sample 3 | 100 | Lupasol ® SKA | 40 |

TABLE 3

Substrates with EAA Coatings

| Substrate | PET thickness (microns) | Coating Thickness (nm) |
|---|---|---|
| Sample 4 | 100 | 40 |
| Sample 5 | 100 | 80 |

Procedure

1. Ingredients of Table 1 are combined and agitated 15 minutes on a paint shaker to mix.
2. Draw downs of the mixtures in Table 1 are prepared on each of the 4 mil PET webs in Tables 2 and 3 using a 12 mil draw down knife to produce approximately 1.2 mil dry fluoropolymer coatings.
3. A heavy bead of pure PVF dispersion (42% in propylene carbonate) is applied along 1 edge of the wet draw down to help facilitate peel testing.
4. The coated webs are clamped into metal frames and placed into preheated ovens at either 200° C. or 220° C. for 3 minutes.
5. The coalesced and dried films are removed from the ovens and allowed to cool.
6. One inch strips are cut perpendicular to the heavy PVF bead.
7. A scalpel is used to initiate peeling at the PVF bead.
8. Peel strengths are measured using a Model 4201 Instron at 2"/min, recording the peak value and averaging 3 samples (ASTM D1876-01 T-Peel Test). If samples easily peeled by hand during the peel initiation step a value of 0 was recorded.

TABLE 4

Peel Testing Results

| Example | Substrate | Fluoropolymer Formulation | 200° C. Bake Temp Peel Strength (KG/in) | 220° C. Bake Temp Peel Strength (KG/in) |
|---|---|---|---|---|
| 1A | Sample 1 | A | 0 | 0 |
| 1B | Sample 1 | B | 0 | 0.76 |
| 1C | Sample 1 | C | 0 | 0 |
| 1D | Sample 1 | D | 1.18 | 1.14* |
| 1E | Sample 1 | E | 0 | 0 |
| 2A | Sample 2 | A | 0.78 | 0.57 |
| 2B | Sample 2 | B | 1.2 | 1.47 |
| 2C | Sample 2 | C | 0 | 0 |
| 2D | Sample 2 | D | 1.46 | 1.28* |
| 2E | Sample 2 | E | 0 | 0 |
| 3A | Sample 3 | A | 0 | 0.59 |
| 3B | Sample 3 | B | 1.36 | 1.26 |
| 3C | Sample 3 | C | 0 | 0 |
| 3D | Sample 3 | D | 1.48 | 1.42* |
| 3E | Sample 3 | E | 0 | 0 |
| 4A | Sample 4 | A | 1.39 | 1.44 |
| 4B | Sample 4 | B | 1.53 | 1.33 |
| 4C | Sample 4 | C | 0 | 1.07 |
| 4D | Sample 4 | D | 1.29 | 1.35* |
| 4E | Sample 4 | E | 0 | 0 |
| 5A | Sample 5 | A | 1.15 | 1.35 |
| 5B | Sample 5 | B | 1.44 | 1.59 |
| 5C | Sample 5 | C | 1.2 | 1.13 |
| 5D | Sample 5 | D | 0 | 1.38* |
| 5E | Sample 5 | E | 0 | 0 |

*denotes formulation/substrate/bake temperature combinations that survive the 1000 hr 85° C./85% humidity cabinet test (only selected samples are tested).

Humidity Cabinet Testing

Sample Preparation

Fluoropolymer coated PET substrates are prepared in the same manner as those of examples 1 through 5 with the exception that the edge bead of step 3 was omitted. After removing the samples from the oven and allowing them to cool, the fluoropolymer coating side is corona treated using a hand held lab corona treater. The corona treated sample was then laminated to a glass panel (4"×8"×⅛") using the following procedure.

The following sandwich is placed on a vacuum plate with a 1" fluoropolymer coated PET overhang:

--------- fluoropolymer coated PET film with fluoropolymer coating face down
- - - - reactive EVA film
------- glass panel 1. The sandwich is centered and covered with a silicone rubber pad
2. A metal frame is placed on the rubber pad and vacuum applied for 20 minutes
3. The sandwich+vacuum plate is placed into a room temperature oven and heating begun to a target of 150° C.
4. The sample is held at 150° C. for 20 minutes
5. The sample is removed from the oven, vacuum released and allowed to cool
6. The resulting laminates are placed into a paint sample rack in a humidity cabinet controlled at 85° C./85% humidity.
7. Samples are exposed to the humidity cabinet for 1000 hours and then examined for adhesion using both peel testing and a cross hatch tape test.

Examples 6-9

Examples 6-9 illustrate PVF coating compositions containing an amine function acrylic adhesive being used to coat PET films primed with polyallylamine primer.

Example 6

Example 6 illustrates the application of a white PVF coating to both sides of unpigmented and pigmented PET film primed with a polyallylamine primer.

A white PVF coating formulation is prepared from the formula in the following Table 5. The thermal stabilizer solution listed in Table 5 is prepared from 4.0 wt % Irganox® 1035 (Ciba), 1 wt % Weston® THOP (Crompton) and 95 wt % propylene carbonate. The amine function acrylic polymer solution listed in Table 5 is prepared by post reacting methyl methacrylate/glycidyl methacrylate (98/2) with ammonia to convert the glycidyl groups into 2-hydroxy-3-aminopropyl groups to produce a primary amine functional acrylic polymer in a solvent of toluene and isopropanol.

TABLE 5

| Ingredient | Wet wt. | Dry wt. | Wt % based on PVF |
|---|---|---|---|
| PVF dispersion (40% in PC) | 58.55 | 23.42 | N.A. |
| White pigment dispersion | 23.55 | 10.65 | 45.5 |
| Thermal stabilizer sol'n | 2.9 | 0.15 | 0.66 |
| Amine functional acrylic sol'n | 14.43 | 4.32 | 18.4 |

Using a doctor blade, the white PVF coating formulation is coated on a 2 mil unpigmented PET film primed with a polyallylamine primer and on barium sulfate pigmented 3.8 mil wide PET film primed with a polyallylamine primer. The coatings are baked in a preheated oven for 10 min at 200° C. for 10 minutes. The cooled coated films are then coated on the opposite side with the same PVF formulation and are baked 15 min at 200° C. Table 6 shows the range of resultant dry film thicknesses for coatings on pigmented and unpigmented PET films:

TABLE 6

| | | film thickness (mils) | | |
|---|---|---|---|---|
| sample | PET Pigmented? | PET | 1st PVF Coating | 2nd PVF Coating |
| 1 | Yes | 3.8 | 1 | 0.7 |
| 2 | Yes | 3.8 | 1.2 | 1.5 |
| 3 | No | 2 | 1 | 1 |
| 4 | No | 2 | 1.2 | 1.3 |
| 5 | No | 2 | 1 | 1 |
| 6 | No | 2 | 1.2 | 1.3 |
| 7 | Yes | 3.8 | 0.7 | 1 |
| 8 | Yes | 3.8 | 1.2 | 1 |

Example 7

Example 7 illustrates the application of a PVF coating containing pearlescent barrier particles of mica to both sides of unpigmented and pigmented PET film primed with a polyallylamine primer.

A pearlescent PVF coating formulation is prepared from the formula in the following Table 7:

TABLE 7

| | Wt % |
|---|---|
| PVF Dispersion | 43.03 |
| Mearlin ® Sparkle 139P (Englehard) | 10.63 |
| Themal Stabilizer Solution | 2.13 |
| Amine functional acrylic polymer solution | 10.63 |
| Propylene Carbonate | 33.58 |

Using a doctor blade, the pearlescent PVF coating formulation is coated on a 2 mil wide, unpigmented PET film primed with a polyallylamine primer and on a 3.8 mil wide, barium sulfate pigmented PET film primed with a polyallylamine primer. These coatings are baked in a preheated oven for 10 min at 200° C. for 10 minutes. The cooled coated films are then coated on the opposite side with the same PVF formulation and baked 15 min at 200° C. Table 8 shows the range of resultant dry coating thicknesses:

TABLE 8

| | | film thickness (mils) | | |
|---|---|---|---|---|
| sample | PET Pigmented? | PET | 1st PVF Coating | 2nd PVF Coating |
| 1 | Yes | 3.8 | 0.8 | 0.5 |
| 2 | Yes | 3.8 | 0.7 | 1 |
| 3 | Yes | 3.8 | 1 | 1.7 |
| 4 | Yes | 3.8 | 0.7 | 1.6 |
| 5 | Yes | 3.8 | 0.95 | 1.05 |
| 6 | Yes | 3.8 | 0.7 | 1 |
| 7 | Yes | 3.8 | 1.2 | 1 |
| 8 | Yes | 3.8 | 1.2 | 1.1 |
| 9 | No | 2 | 1 | 1 |
| 10 | No | 2 | 0.9 | 1 |
| 11 | No | 2 | 1 | 1 |
| 12 | No | 2 | 1.3 | 1.45 |
| 13 | No | 2 | 1.3 | 1.5 |

Example 8

In Example 8, the vapor barrier properties of two side coated PET films of Example 6 (sample 7) and Example 7 (sample 2) having white pigmented and mica pigmented fluoropolymer coatings, respectively, are evaluated by measuring the Water Vapor Transmission Rate (WVTR). Table 9 shows the improvement of vapor barrier properties when using barrier particles such as mica, as indicated by a lower WVTR value.

TABLE 9

| Side 1 Pigment | Side 2 Pigment | PVF/PET/PVF thicknesses (mils) | WVTR g/m²/day |
|---|---|---|---|
| white | white | 0.7/3.8/1.0 | 5.53 |
| pearl | pearl | 0.7/3.8/1.0 | 2.052 |

Example 9

In Example 9, the shrinkage properties of white two side coated PET samples made according to Example 6 (sample 1) are compared with samples of PET films with conventional preformed PVF films laminated to both sides. The former contained a filler (barium sulfate) in the PET substrate, while the latter did not. Table 10 shows the measured shrinkage data at various temperatures.

TABLE 10

| °F. | Two side Coated Film | Two side Laminated Film |
|---|---|---|
| | % Change in Machine Direction Dimension as a function of Temperature | |
| 25 | 0.000 | 0.000 |
| 50 | 0.000 | 0.000 |
| 100 | 0.000 | −0.084 |
| 150 | −0.083 | −0.669 |
| 200 | −0.083 | −3.177 |
| | % Change in Tranverse Direction Dimension as a function of Temperature | |
| 25 | 0.000 | 0.000 |
| 50 | 0.000 | −0.083 |
| 100 | 0.084 | −0.083 |
| 150 | 0.000 | −0.166 |
| 200 | 0.084 | −2.912 |

Note:
Two side Coated film layer thicknesses (mils) 1/3.8/0.7
Two side laminated film layer thicknesses (mils) 1.5/3/1.5

Example 10

Example 10 illustrates the application of a white pigmented and an unpigmented polyvinylidene (PVDF) coating to one side of an unpigmented and a pigmented PET film primed with a polyallylamine primer.

The unpigmented PVDF coating formulation is prepared from the following components shown in Table 11:

TABLE 11

| Material | Source | Wt % |
|---|---|---|
| Polyvinylidene Fluoride | Aldrich | 21.03 |
| Amine functional acrylic polymer solution (1) | DuPont | 32.9 |
| Propylene Carbonate | Huntsman | 46.07 |

(1) Methyl methacrylate/glycidyl methacrylate (98/2) post reacted with ammonia to convert the glycidyl groups into 2-hydroxy-3-aminopropyl groups to produce a primary amine functional acrylic polymer in a solvent of toluene and isopropanol.

The mixture is dispersed on a paint shaker in the presence of 3 mm glass beads for 10 minutes.

The white pigmented coating formulation is prepared from the following components shown in Table 12:

TABLE 12

| Material | Wt % |
|---|---|
| Clear PVDF Formulation | 78.32 |
| White dispersion | 21.68 |

Using a 7 mil doctor blade, both the clear PVDF formulation and the white PVDF formulation are coated on unpigmented 2 mil PET film and pigmented 3.8 mil PET film primed with a polyallylamine primer using a 7-mil doctor blade. A comparison 3.8 mil unprimed PET is similarly coated. The coated films were baked in a preheated 400° F. convection oven for 5 minutes. After cooling, a scalpel was used to attempt to remove the PVF films from PET films. Both the pigmented and unpigmented films could be peeled from unprimed PET but could not be peeled from primed PET.

What is claimed is:

1. A photovoltaic module backsheet comprising:
a polyester film having opposite first and second surfaces, first and second fluoropolymer coatings on said first and second surfaces of said polyester film, respectively, said first and second fluoropolymer coatings each comprising fluoropolymer selected from homopolymers and copolymers of vinyl fluoride and homopolymers and copolymers of vinylidene fluoride polymer blended with compatible adhesive polymer comprising a backbone that is compatible with said fluoropolymer and pendant functional groups, said pendant functional groups selected from carboxylic acid, sulfonic acid, aziridine, anhydride, amine, isocyanate, melamine, epoxy, hydroxy and mixtures thereof;
wherein said first and second surfaces of said polyester film comprise functional groups on each surface that interact with said pendant functional groups of the compatible adhesive polymer in said first and second fluoropolymer coatings to promote bonding of said first and second fluoropolymer coatings to said respective first and second surfaces of said polyester film, and wherein said first and second fluoropolymer coatings are first and second surface layers of the photovoltaic module backsheet.

2. The photovoltaic module backsheet of claim 1, wherein the backbone of the compatible adhesive polymer in said first and second fluoropolymer coatings is selected from acrylic, urethane, aliphatic polyester, polyester urethane, acrylamide, urea and polycarbonate backbones.

3. The photovoltaic module backsheet of claim 1 wherein said compatible adhesive polymer is a functional acrylic polymer.

4. The photovoltaic module backsheet of claim 1 wherein said compatible adhesion-promoting polymer is an amine functional acrylic polymer.

5. The photovoltaic module backsheet of claim 1 wherein said functional groups on the first and second surfaces of said polyester film are selected from carboxylic acid, sulfonic acid, aziridine, amine, isocyanate, melamine, epoxy, hydroxy, anhydride and mixtures thereof.

6. The photovoltaic module backsheet of claim 1 comprising first and second primers on said respective first and second surfaces of said polyester film, said first and second primers providing said functional groups on the first and second surfaces of said polyester film that interact with said adhesive polymer to promote bonding of said first and second fluoropolymer coatings to said respective first and second surfaces of said polyester film.

7. The photovoltaic module backsheet of claim 6 wherein said first and second primers comprise a polymer selected from polyallylamine/melamine polymer, polyethylene imine polymer, ethylene acrylic acid copolymer, and acid modified polyolefin.

8. The photovoltaic module backsheet of claim 6 wherein at least one of said first and second primers is an acid or anhydride functional thermoplastic polymer that is coextruded with said polyester film.

9. The photovoltaic module of claim 1 wherein said first and second fluoropolymer coatings each have a thickness of about 0.1 to about 2.0 mils.

10. The photovoltaic module backsheet of claim 1 wherein said first and second fluoropolymer coatings each comprise platelet-shaped barrier particles having an average particle size of 10 to 200 microns.

11. The photovoltaic module backsheet of claim 10 wherein said first and second fluoropolymer coatings each comprise about 0.5 to about 10 weight % of platelet-shaped barrier particles based on total dry weight of the fluoropolymer in each fluoropolymer coating.

12. The photovoltaic module backsheet of claim 1 wherein said fluoropolymer of said first and second fluoropolymer coatings is selected from homopolymers and copolymers of vinyl fluoride comprising at least 60 mole % vinyl fluoride and homopolymers and copolymers of vinylidene fluoride comprising at least 60 mole % vinylidene fluoride.

13. The photovoltaic module backsheet of claim 1 wherein said fluoropolymer of said first and second fluoropolymer coatings comprises about 1 to about 40 weight % of said compatible adhesive polymer based on fluoropolymer solids content.

14. The photovoltaic module backsheet of claim 1 wherein said polyester film has a thickness of about 0.5 to about 10 mils.

15. A photovoltaic module comprising:
photovoltaic cells;
an encapsulating layer on said photovoltaic cells;
a backsheet adhered to the encapsulating layer, the backsheet comprising a polyester film having opposite first and second surfaces, and first and second fluoropolymer coatings on said first and second surfaces of said polyester film, respectively, said first and second fluoropolymer coatings each comprising fluoropolymer selected from homopolymers and copolymers of vinyl fluoride and homopolymers and copolymers of vinylidene fluoride polymer blended with compatible adhesive polymer comprising a backbone that is compatible with said fluoropolymer and pendant functional groups, said pendant functional groups selected from carboxylic acid, sulfonic acid, aziridine, anhydride, amine, isocyanate, melamine, epoxy, hydroxy and mixtures thereof, wherein said first and second surfaces of said polyester film comprise functional groups on each surface that interact with said pendant functional groups of the compatible adhesive polymer in said first and second fluoropolymer coatings to promote bonding of said first and second fluoropolymer coatings to said respective first and second surfaces of said polyester film.

16. The photovoltaic module of claim 15, wherein the backbone of the compatible adhesive polymer in said first and second fluoropolymer coatings is selected from acrylic, urethane, aliphatic polyester, polyester urethane, acrylamide, urea and polycarbonate backbones.

17. The photovoltaic module of claim 15, wherein said functional groups on the first and second surfaces of said polyester film are selected from carboxylic acid, sulfonic acid, aziridine, amine, isocyanate, melamine, epoxy, hydroxy, anhydride and mixtures thereof.

18. The photovoltaic module of claim 15, wherein said first and second fluoropolymer coatings each have a thickness of about 0.1 to about 2.0 mils, and wherein said first and second fluoropolymer coatings each comprise platelet-shaped barrier particles having an average particle size of 10 to 200 microns.

19. The photovoltaic module of claim 18, wherein said first and second fluoropolymer coatings each comprise about 0.5 to about 10 weight % of platelet-shaped barrier particles based on total dry weight of the fluoropolymer in each fluoropolymer coating.

* * * * *